United States Patent
Adachi

(10) Patent No.: US 10,014,236 B2
(45) Date of Patent: Jul. 3, 2018

(54) SEMICONDUCTOR DEVICE

(71) Applicant: FUJI ELECTRIC CO., LTD., Kawasaki-shi (JP)

(72) Inventor: Shinichiro Adachi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/511,734

(22) Filed: Oct. 10, 2014

(65) Prior Publication Data
US 2015/0021756 A1    Jan. 22, 2015

Related U.S. Application Data

(63) Continuation of application No. PCT/JP2013/077235, filed on Oct. 7, 2013.

(30) Foreign Application Priority Data

Oct. 29, 2012    (JP) .................. 2012-238284

(51) Int. Cl.
| H01L 23/473 | (2006.01) |
| H01L 23/367 | (2006.01) |
| H05K 7/20 | (2006.01) |

(52) U.S. Cl.
CPC ...... *H01L 23/3672* (2013.01); *H01L 23/3675* (2013.01); *H01L 23/473* (2013.01); *H05K 7/20927* (2013.01); *H01L 2924/0002* (2013.01)

(58) Field of Classification Search
CPC ............... H01L 23/473; H01L 23/3675; H01L 23/3672
USPC ........................................................ 257/714
See application file for complete search history.

(56) References Cited

U.S. PATENT DOCUMENTS

| 4,884,630 | A | * | 12/1989 | Nelson .................. H01L 23/473 |
| | | | | 165/170 |
| 6,414,867 | B2 | * | 7/2002 | Suzuki et al. ................ 363/141 |
| 7,301,770 | B2 | * | 11/2007 | Campbell et al. ............ 361/699 |
| 8,902,589 | B2 | * | 12/2014 | Gohara et al. ................ 361/699 |

(Continued)

FOREIGN PATENT DOCUMENTS

| CN | 101297401 A | 10/2008 |
| CN | 102549743 A | 7/2012 |

(Continued)

OTHER PUBLICATIONS

European Search Report from corresponding European Patent application dated Jan. 7, 2016.

(Continued)

*Primary Examiner* — Jarrett Stark
*Assistant Examiner* — Charles N Ausar-El
(74) *Attorney, Agent, or Firm* — Rabin & Berdo, P.C.

(57) ABSTRACT

A semiconductor device includes an insulating substrate, semiconductor elements and a cooling device. The cooling device includes a heat radiation substrate, fins, and a cooling case of a box-like shape that accommodates the fins and has a bottom wall and side walls. An introducing port and a discharge port for a cooling liquid are provided diagonally in a pair of side walls provided along the longitudinal direction of the assembly of the fins, among the side walls of the cooling case. A diffusion wall facing the introducing port is provided inside the cooling case.

19 Claims, 9 Drawing Sheets

(56) References Cited

U.S. PATENT DOCUMENTS

| | | | |
|---|---|---|---|
| 9,237,676 B2* | 1/2016 | Gohara | H01L 23/3735 |
| 9,245,821 B2* | 1/2016 | Gohara | H01L 23/3735 |
| 9,472,488 B2* | 10/2016 | Gohara | H01L 23/473 |
| 9,671,179 B2* | 6/2017 | Mori | F28F 3/12 |
| 9,818,670 B2* | 11/2017 | Macall | H01L 23/4006 |
| 9,915,986 B2* | 3/2018 | Tanner | G06F 1/203 |
| 2002/0101718 A1 | 8/2002 | Negishi et al. | |
| 2004/0182548 A1* | 9/2004 | Lovette et al. | 165/103 |
| 2005/0063161 A1* | 3/2005 | Yanase et al. | 361/707 |
| 2007/0227697 A1* | 10/2007 | Takahashi | 165/80.4 |
| 2008/0179736 A1* | 7/2008 | Hartwell et al. | 257/714 |
| 2008/0302508 A1* | 12/2008 | Lin | F28F 3/02 |
| | | | 165/80.3 |
| 2009/0065178 A1* | 3/2009 | Kasezawa | H01L 23/473 |
| | | | 165/104.19 |
| 2009/0095450 A1 | 4/2009 | Asakura | |
| 2009/0145581 A1* | 6/2009 | Hoffman | F28F 1/40 |
| | | | 165/80.3 |
| 2009/0146293 A1* | 6/2009 | Olesen | H01L 23/473 |
| | | | 257/714 |
| 2010/0025126 A1* | 2/2010 | Nakatsu et al. | 180/65.1 |
| 2010/0051234 A1* | 3/2010 | Mori | H01L 23/473 |
| | | | 165/104.19 |
| 2010/0078155 A1* | 4/2010 | Morra | 165/104.32 |
| 2010/0172091 A1* | 7/2010 | Nishiura | H01L 23/3735 |
| | | | 361/689 |
| 2010/0252235 A1* | 10/2010 | Mori | H01L 23/473 |
| | | | 165/104.19 |
| 2011/0188204 A1* | 8/2011 | Horiuchi | H01L 23/473 |
| | | | 361/702 |
| 2011/0272121 A1* | 11/2011 | Suzuki | H01L 23/473 |
| | | | 165/104.19 |
| 2012/0132400 A1* | 5/2012 | Hosokawa | H01L 23/3672 |
| | | | 165/104.19 |
| 2012/0139096 A1* | 6/2012 | Gohara et al. | 257/706 |
| 2012/0168128 A1* | 7/2012 | Vafai | F28F 13/06 |
| | | | 165/104.19 |
| 2012/0218714 A1* | 8/2012 | Robert | H01L 23/053 |
| | | | 361/713 |
| 2013/0062750 A1* | 3/2013 | Lenniger et al. | 257/691 |
| 2013/0134572 A1* | 5/2013 | Lenniger et al. | 257/690 |
| 2013/0153186 A1* | 6/2013 | Gotou et al. | 165/168 |
| 2013/0199767 A1* | 8/2013 | Karidis et al. | 165/185 |
| 2013/0314870 A1* | 11/2013 | Kwak | H05K 7/20927 |
| | | | 361/689 |
| 2015/0216074 A1* | 7/2015 | Nishihara | H01L 23/367 |
| | | | 361/704 |

FOREIGN PATENT DOCUMENTS

| | | | |
|---|---|---|---|
| DE | 112006002839 T5 | | 9/2008 |
| EP | 2711983 A1 | | 3/2014 |
| JP | 2001-035981 A | | 2/2001 |
| JP | 2001-308246 A | | 11/2001 |
| JP | 2002-098454 A | | 4/2002 |
| JP | 2005-019905 A | | 1/2005 |
| JP | 2006-310363 A | | 11/2006 |
| JP | 2007-123607 A | | 5/2007 |
| JP | 2007-294891 A | | 11/2007 |
| JP | 2010123881 | * | 3/2010 |
| JP | 2011-103369 A | | 5/2011 |
| JP | 2012-044119 A | | 3/2012 |
| WO | WO-2011/018882 A1 | | 2/2011 |
| WO | WO 2011132736 A1 | * | 10/2011 |

OTHER PUBLICATIONS

Japanese Office Action received in the corresponding Japanese Patent application dated Dec. 1, 2015.

* cited by examiner

SEMICONDUCTOR DEVICE

This application is a continuation under 35 U.S.C. 120 of International Application PCT/JP2013/077235 having the International Filing Date of Oct. 7, 2013, and having the benefit of the earlier filing date of Japanese Application No. 2012-238284, filed Oct. 29, 2012. All of the identified applications are fully incorporated herein by reference.

TECHNICAL FIELD

The present invention relates to a semiconductor device equipped with a cooling device for cooling semiconductor elements.

BACKGROUND ART

Apparatuses using electric motors, such as hybrid automobiles and electric automobiles, use power conversion devices to save energy. Such power conversion devices typically use a semiconductor module. The semiconductor module constituting a control device serving to save energy is provided with a power semiconductor element that controls a large electric current. The usual power semiconductor element generates heat when a large electric current is controlled, and the amount of the generated heat increases with the miniaturization and increase in output of the power conversion device. Therefore, in a case of a semiconductor module provided with a plurality of power semiconductor elements, cooling the semiconductor module is a significant problem.

Cooling devices of a liquid cooling system have been used as cooling devices to be attached to semiconductor modules in order to cool the modules. Such a cooling device of a liquid cooling system is provided with a heat radiation substrate that is made from a metal and joined to an insulating substrate carrying the power semiconductor elements on the side thereof opposite that where the semiconductor module is disposed, heat radiation fins formed integrally with the heat radiation substrate, and a box-shaped cooling case that accommodates the fins and is liquid tightly attached to the heat radiation substrate. An introducing port and a discharge port for a cooling medium (cooling liquid) are connected to the cooling case. A flow path is formed inside the cooling case for the cooling medium introduced into the cooling case from the introducing port to pass through the fins and be discharged from the discharge port. The cooling medium (for example, water or a long-life coolant) pressurized by an external pump is introduced from the introducing port and flows through the flow path inside the cooling case. As a result, the thermal energy generated by the power semiconductor elements is released through the fins to the cooling medium. The cooling medium is discharged from the discharge port, cooled in an external heat exchanger, pressurized by the pump, and then returned into the flow path inside the cooling case.

A cooling device of such type is known in which an inlet and an outlet for a cooling medium are provided at the longitudinal ends of the cooling device, fins provided correspondingly to a plurality of semiconductor modules are arranged along the longitudinal direction of the cooling device in the flow path inside the cooling device between the inlet and outlet, and a cooling medium is brought into direct contact with the fins (Patent Document 1, identified further on). In the cooling device described in Patent Document 1, the inlet and outlet for the cooling medium are provided at the rear surface of a heat sink, in other words, at the bottom surface of the cooling device.

A variety of measures have been taken to increase the cooling efficiency of the cooling device of a liquid cooling system. Thus, it has been suggested to increase the flow rate of the cooling medium, provide the heat-radiating fins (cooling bodies) in the cooling device with a shape ensuring good thermal conductivity, and use materials with a high thermal conductivity to configure the fins.

For example, a cooling device has been suggested in which a wall for enhancing the diffusion of a cooling medium is provided between an inlet portion and a cooling medium passage (Patent Document 2, identified further on). A cooling device has also been disclosed in which a groove or a protrusion for diffusing a coolant is provided between the inlet and outlet of the cooling device (Patent Document 3, identified further on). A cooling device has also been suggested in which an introducing tube and a discharge tube for a cooling agent are provided in the vicinity of the corner portion of the circumferential end on the longitudinal end side of a radiator, and a columnar member is provided between the introducing tube and discharge tube (Patent Document 4, identified further on). A cooling device has also been disclosed in which heat radiation protrusions are provided in a rectangular base portion (except for the corners thereof) integrated with a circumferential wall portion, an inflow port and an outflow port for a cooling medium are provided in a lower lid provided opposite the tips of the heat radiation protrusions, the turbulence of the cooling medium in the corners of the base portion is enhanced and cooling efficiency is increased (Patent Document 5, identified further on).

Patent Document 1: Japanese Patent Application Publication No. 2001-308246 (see paragraph [0018] and FIG. 1)
Patent Document 2: Japanese Patent Application Publication No. 2007-123607 (see claims and paragraph [0041])
Patent Document 3: Japanese Patent Application Publication No. 2005-19905 (see claims and FIG. 1)
Patent Document 4: Japanese Patent Application Publication No. 2007-294891 (see paragraph [0017])
Patent Document 5: Japanese Patent Application Publication No. 2011-103369 (see paragraph [0031] and FIG. 1)

In the cooling device described in Patent Document 1, the flow rate of the cooling medium flowing inside the cooling device is large in the lateral central portion of the flow path thereof and small on the periphery thereof. Therefore, there is a difference in the degree of cooling between the semiconductor elements disposed close to the lateral center of the flow path of the cooling medium flowing in the cooling device and the semiconductor elements disposed on the periphery. In this regard, where a wall, a groove, or a protrusion for enhancing the diffusion of the cooling medium is provided, as described in Patent Documents 2 to 5, the spread of the flow rate in the lateral direction of the passage can be suppressed and the difference in the degree of cooling of the semiconductor elements can be suppressed.

However, the demand for increased heat radiation ability of cooling devices continues to grow, and the heat radiation ability needs to be increased as the power conversion devices are reduced in size and increased in power.

Further, in the cooling devices described in Patent Document 1 and Patent Document 5, the inlet and outlet of the cooling medium are provided in the bottom surface of the cooling device. As a result, no electronic component, such as a film capacitor, can be attached to the bottom surface of the cooling device.

SUMMARY

The present invention effectively resolves the abovementioned problems, and it is an object thereof to provide a semiconductor device equipped with a cooling device such that the heat radiation ability can be increased, the space below the bottom surface of the cooling device can be effectively used, and an electronic component can be attached to the bottom surface of the cooling device.

The following semiconductor device is provided to attain the abovementioned object.

The semiconductor device includes: an insulating substrate; a semiconductor element carried on the insulating substrate; and a cooling device that cools the semiconductor element. The cooling device includes: a heat radiation substrate joined to the insulating substrate; a plurality of fins provided in a substantially rectangular region on a surface of the heat radiation substrate on a side opposite that of a surface joined to the insulating substrate; and a cooling case of a box-like shape that accommodates the fins and has a bottom wall and side walls. An introducing port and a discharge port for a cooling medium are provided at positions shifted in mutually opposite directions from a laterally central line of an assembly of the fins in a pair of a first side wall and a second side wall provided along a longitudinal direction of the assembly of the fins, among the side walls of the cooling case. A diffusion wall causing the cooling medium introduced from the introducing port to diffuse along the first side wall is provided between the first side wall, in which the introducing port is provided, and the bottom wall.

In accordance with the present invention, the introducing port for the cooling medium is provided in the first side wall, and the discharge port for the cooling medium is provided in the second side wall, the first and second side walls being provided in the longitudinal direction of the fin assembly, among the side walls of the cooling case. Therefore, it is possible to form a flow path for the cooling medium in the lateral direction of the fin assembly, thereby increasing the heat radiation ability. Further, since the diffusion wall is provided between the first side wall and the bottom wall of the cooling case, the pressure loss of the cooling medium flowing in the flow path in the lateral direction of the fin assembly can be reduced and the flow rate can be made uniform. In addition, since the introducing port and discharge port are provided at positions shifted in mutually opposite directions from the central line in the lateral direction of the fin assembly, an electronic component such as a film capacitor can be attached to the bottom wall of the cooling case.

DETAILED DESCRIPTION

An embodiment of the semiconductor device in accordance with the present invention will be explained below in greater detail with reference to the drawings.

Figure 1A:
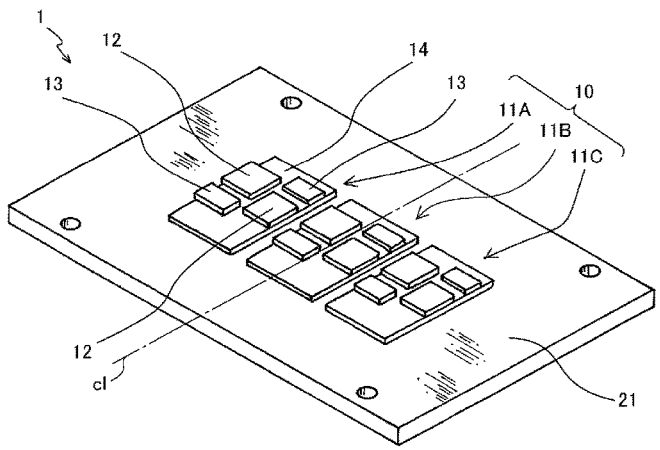
FIGS. 1A, 1B and 1C are perspective views of an embodiment of the semiconductor device in accordance with the present invention.
Figure 1B:
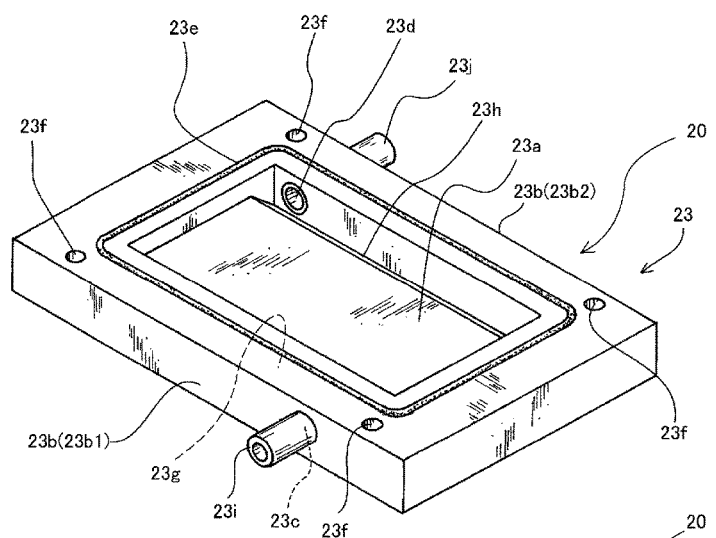
Figure 1C:
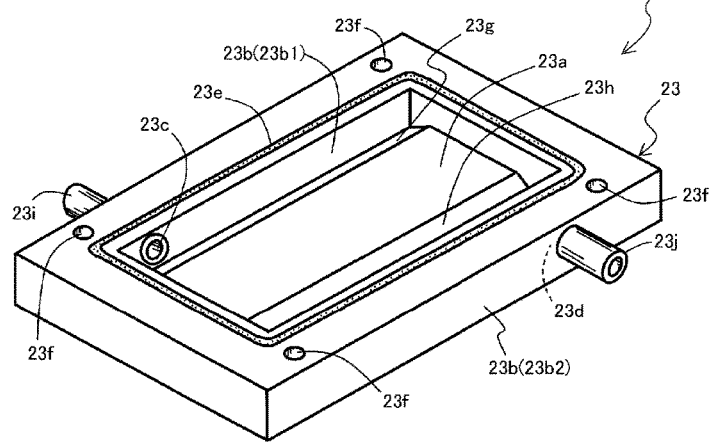
Figure 3:
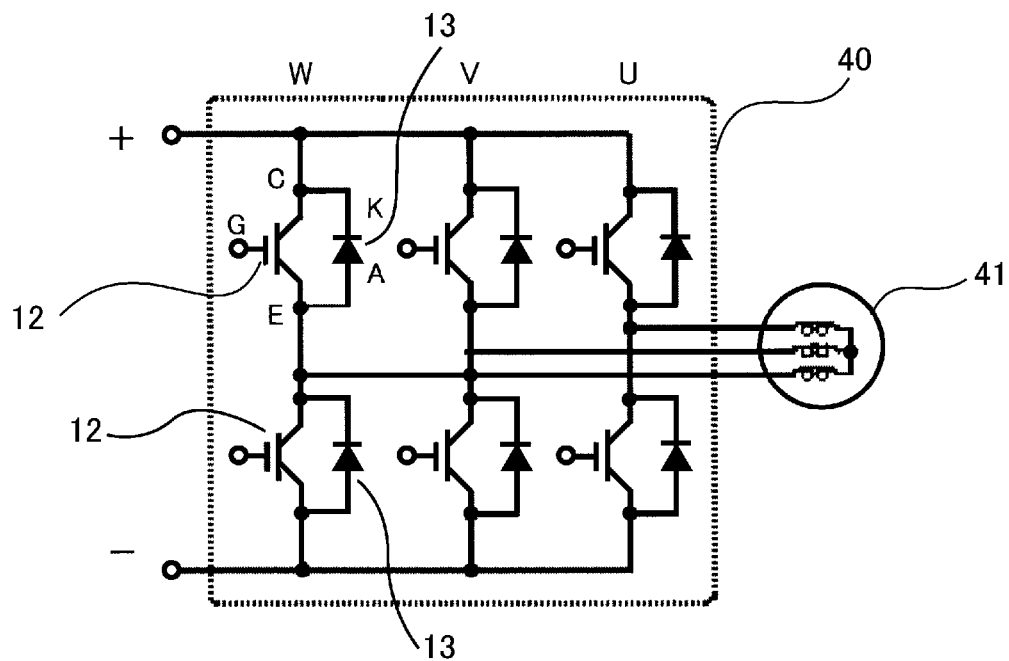
FIG. 3 is a circuit diagram of a semiconductor module configured as a three-phase inverter device.

A semiconductor device 1 of the embodiment of the present invention, which is shown in perspective views in FIGS. 1A, 1B, and 1C, is provided with a semiconductor module 10 and a cooling device 20 that cools the semiconductor module 10. In the embodiment shown in the figures, the semiconductor module 10 has a plurality of circuit element portions 11A, 11B, 11C disposed on a heat radiation substrate 21 of the cooling device 20. A three-phase inverter circuit of the semiconductor module 10 is configured by those circuit element portions 11A, 11B, 11C. More specifically, the circuit element portions 11A, 11B, 11C are configured as a W phase circuit, V phase circuit, and U phase circuit forming a three-phase inverter circuit 40 shown in the circuit diagram in FIG. 3. In the configuration shown in FIG. 3, a three-phase AC motor 41 is connected to the three-phase inverter circuit 40.

As shown in FIG. 1A, in the circuit element portion 11A serving as the W phase circuit, an IGBT element 12, which serves as a semiconductor element constituting an upper arm, and a free-wheel diode 13 connected reversely in parallel with the IGBT element 12, and an IGBT element 12, which constitutes a lower arm, and a free-wheel diode 13 connected reversely in parallel with the IGBT element 12 are mounted on an insulating substrate 14 attached to the heat radiation substrate 21. The circuit element portion 11B serving as the V phase circuit and the circuit element portion 11C serving as the U phase circuit have the configuration same as that of the circuit element portion 11A. A circuit pattern for configuring the abovementioned circuit is formed on each insulating substrate 14. In the above-described example, the semiconductor module 10 is configured as a three-phase inverter circuit, but the semiconductor module 10 in accordance with the present invention is not limited to the three-phase inverter circuit configuration.

Figure 2A:
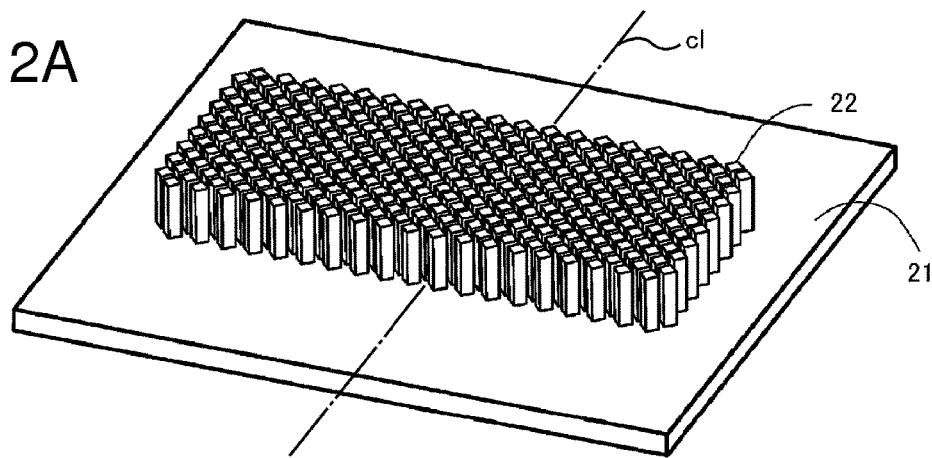
FIGS. 2A, 2B and 2C are perspective views illustrating the shape of fins of three types.

The cooling device 20 is provided with the heat radiation substrate 21 shown in FIG. 1A, fins 22 shown in FIG. 2A, and a cooling case 23 shown in FIG. 1B. FIG. 1C shows the rotated cooling case 23 shown in FIG. 1B. The fins 22 are formed integrally with the heat radiation substrate 21 on the surface of the heat radiation substrate 21 opposite that where the circuit element portions 11A, 11B, 11C are attached. The fins 22 are accommodated inside the cooling case 23. The cooling case 23 can be also referred to as a coolant jacket or a water jacket.

In FIG. 1A, the insulating substrates 14 of the circuit element portions 11A, 11B, 11C are joined to the heat radiation substrate 21. As a result, the insulating substrates 14 and also the IGBT elements 12 and free-wheel diodes 13 carried on the insulating substrates 14 are thermoconductively connected to the cooling device 20. A metal layer to be used for joining to the heat radiation substrate 21 may be formed on each insulating substrate 14. A line cl in FIG. 1A is a central line, in the short-side direction, of the assembly of the fins 22 shown in FIG. 2A that are integrally attached to the heat radiation substrate 21.

Figure 2B:
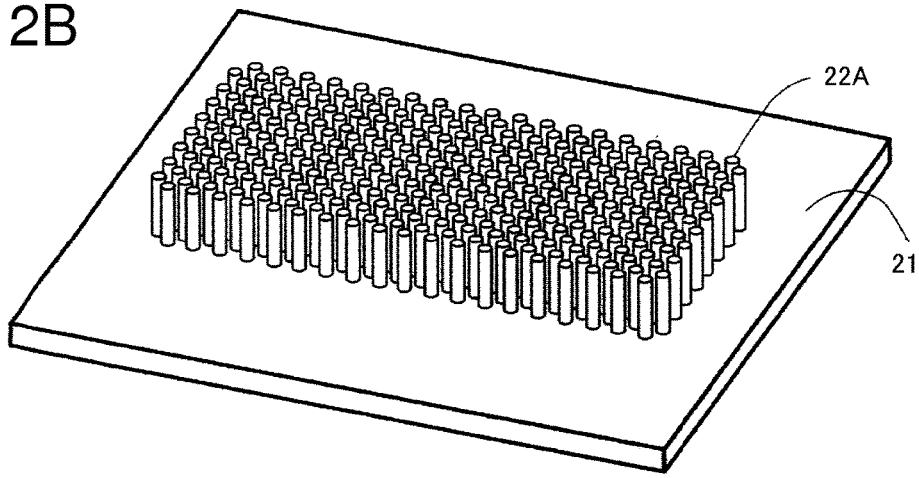
Figure 2C:
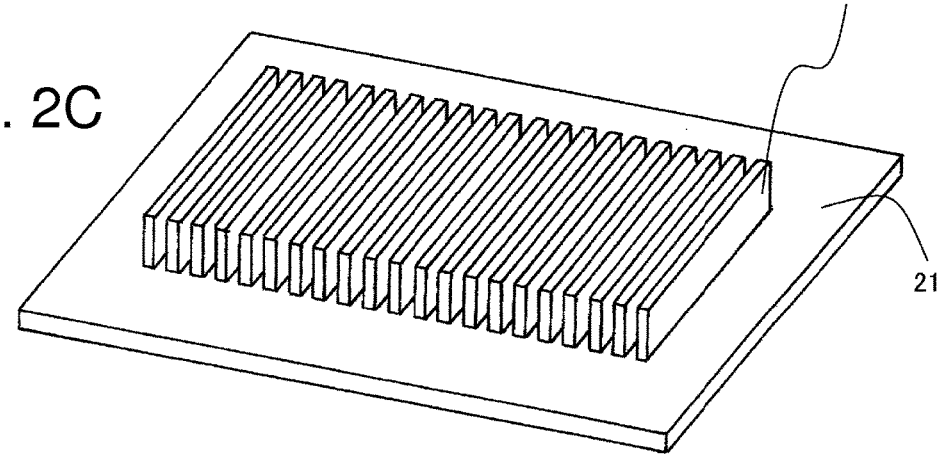

The fins 22 integrally attached to the heat radiation substrate 21 are used as a heat radiation plate, that is, the so-called heat sink. For example, pin fins in which a plurality of pins of a square columnar shape (angular pins) shown in FIG. 2A is arranged at an interval with a predetermined pitch can be used as the fins 22. Further, pin fins 22A in which a plurality of cylindrical pins (round pins) shown in FIG. 2B are arranged at an interval with a predetermined pitch can be also used. Furthermore, blade fins 22B in which a plurality of blade-shaped fins shown in FIG. 2C are provided parallel to each other can be also used. From the standpoint of increasing the heat radiation performance, it is preferred that the pin fins 22, 22A shown in FIGS. 2A and 2B, among the fins shown in FIGS. 2A to 2C, be used because such fins make it possible to increase the density of fins over that of the blade fins 22B shown in FIG. 2C. Further, the angular pin fins 22 shown in FIG. 2A make it possible to increase the flow rate around the pins and also increase the surface area per one pin, thereby enabling the heat exchange with an efficiency higher than that attained with the round pin fins 22A shown in FIG. 2B. In the explanation below, the angular pin fins 22 shown in FIG. 2A are considered as the representative fins.

The shape and dimensions of the fins 22 are preferably set, as appropriate, with consideration for the conditions under which a cooling medium is introduced into the cooling device 20 (that is, pump performance and the like), type and properties (in particular, viscosity) of the cooling medium, and target heat removal amount. Further, the fins 22 are formed to a height such that a predetermined clearance is present between the tips of the fins 22 and the bottom wall of the cooling case 23 when the fins are accommodated in the cooling case 23.

In the heat radiation substrate 21, a region where the fins 22 are integrally attached to the heat radiation substrate 21 is preferably a region including a region obtained by projecting a region carrying the IGBT elements 12 and free-wheel diodes 13, which serve as semiconductor elements on the insulating substrate 14, in the thickness direction of the heat radiation substrate 21 in a state in which the heat radiation substrate 21 is joined to the insulating substrate 14. In other words, this region preferably includes the region directly below the IGBT elements 12 and free-wheel diodes 13.

The assembly of the fins 22 is of a substantially rectangular parallelepiped, preferably rectangular parallelepiped, outer shape, and may have a chamfered or deformed shape, provided that the effect of the present invention is not lost. FIG. 2A shows the central line cl, in the lateral direction, of the assembly of the fins 22 having the rectangular parallelepiped outer shape.

Figure 4:
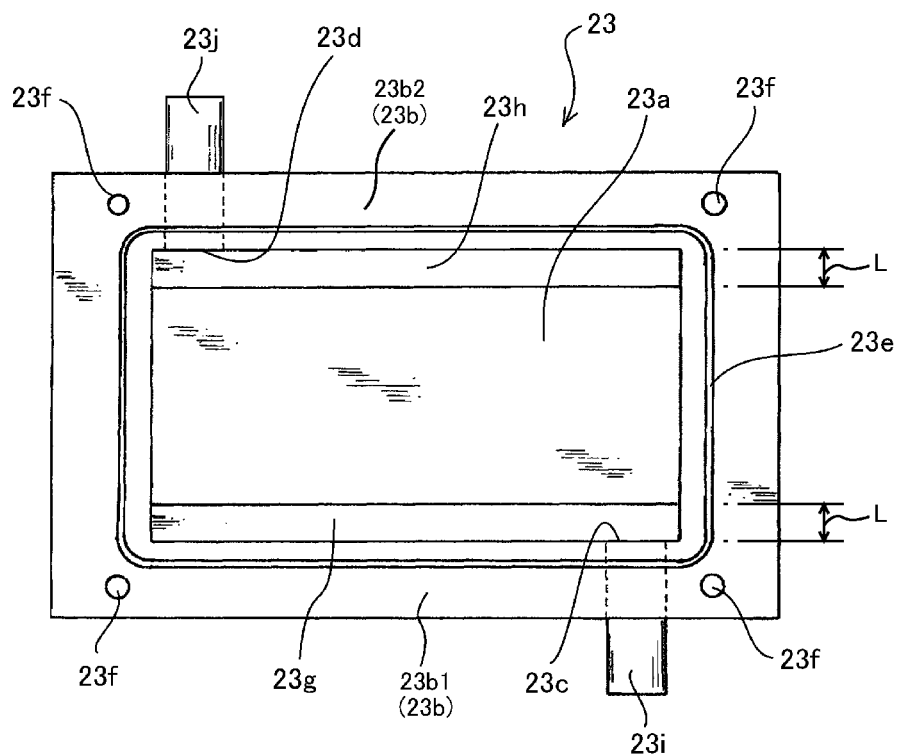
FIG. 4 is a plan view of the cooling case of the cooling device.

As follows from the perspective view in FIG. 1B and the plan view in FIG. 4, the cooling case 23 accommodating the fins 22 is of a box-like shape with an open upper portion which has a bottom wall 23a and a side wall 23b provided on the circumferential edge of the bottom wall 23a. The opening of the cooling case 23 is of a rectangular shape that matches the outer shape of the assembly of the fins 22. The cooling case 23 has a substantially rectangular parallelepiped outer shape, and the longitudinal direction thereof matches the longitudinal direction of the assembly of the fins 22.

In the cooling case 23, an introducing port 23c for introducing the cooling medium into the cooling case 23 is provided close to the corner of a first side wall 23b1, among the side walls 23b on the long side, and a discharge port 23d for discharging the cooling medium from the cooling case 23 to the outside is provided close to the corner of a second side wall 23b2, among the side walls 23b on the long side. In other words, the cooling medium introducing port 23c and discharge port 23d are provided in the first side wall 23b1 and the second side wall 23b2 at positions shifted in the mutually opposite directions from the central line cl, in the lateral direction, of the assembly of the fins 22. On the upper surface of the side wall 23b, the heat radiation substrate 21 is attached to the cooling case 23, an O-ring 23e is attached for preventing the cooling medium from leaking from the inside of the cooling case 23 when the cooling medium flows into the cooling case 23, and threaded holes 23f for screwing the heat radiation substrate 21 are formed in the four inner corners. The leak can be prevented by using a metal gasket or a liquid packing.

A diffusion wall 23g, which causes the cooling medium introduced from the introducing port 23c to diffuse along the first side wall 23b1, is provided between the first side wall 23b1 and the bottom wall 23a inside the cooling case 23 along the longitudinal direction of the cooling case 23. Further, a converging wall 23h, which causes the cooling medium to converge to the discharge port 23d along the second side wall 23b2, is provided inside the cooling case 23 between the second side wall 23b2 and the bottom wall 23a along the longitudinal direction of the cooling case 23.

Figure 5:
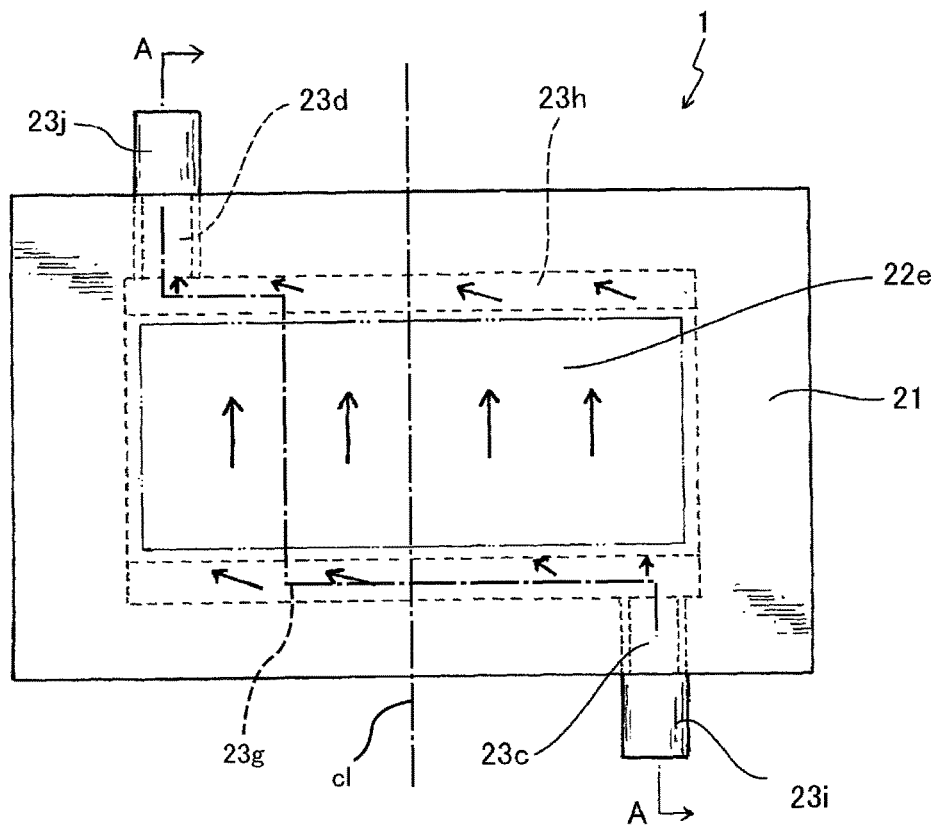
FIG. 5 is a plan view of the cooling case with the heat radiation substrate attached thereto.
Figure 6:
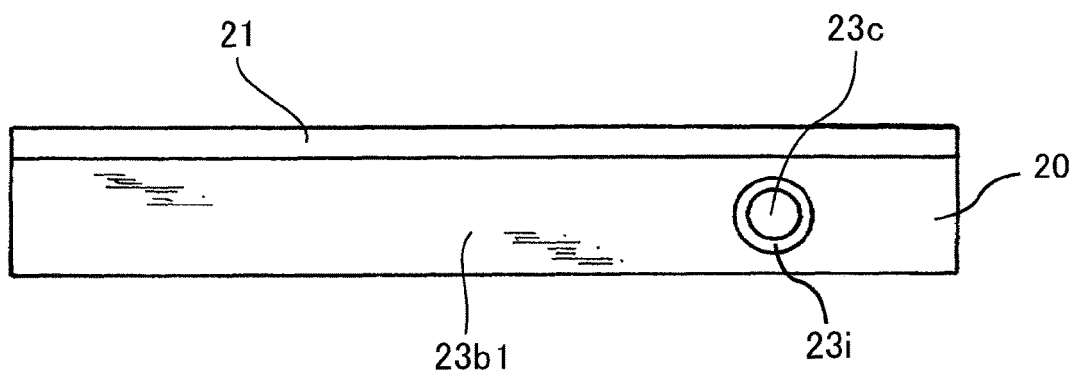
FIG. 6 is a side view of the cooling case with the heat radiation substrate attached thereto.
Figure 7:
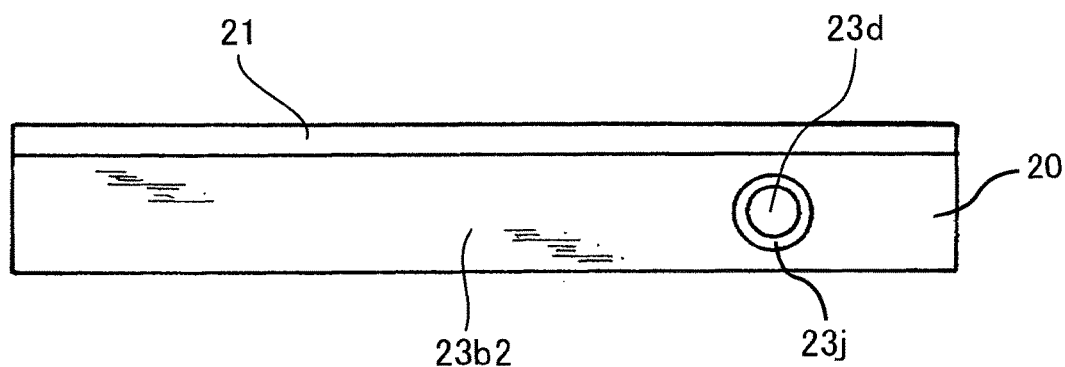
FIG. 7 is a side view of the cooling case with the heat radiation substrate attached thereto.
Figure 8:
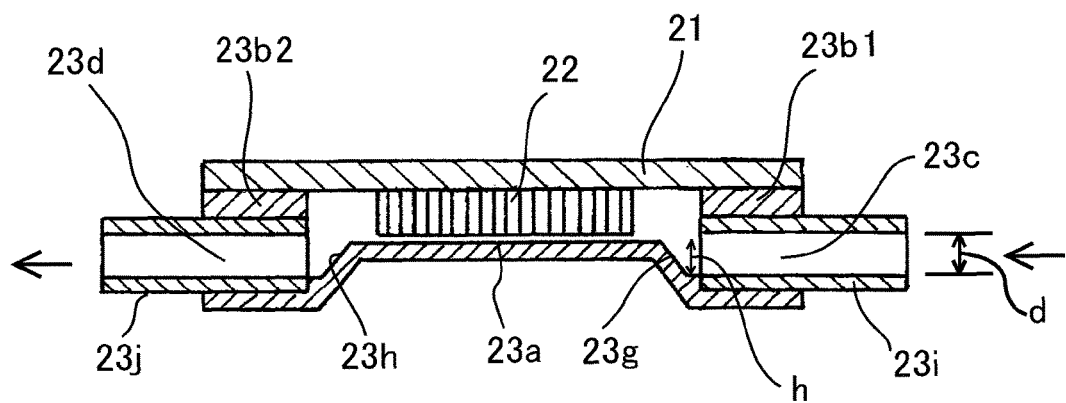
FIG. 8 is a cross-sectional view taken along the A-A line in FIG. 5.

FIG. 5 is a plan view taken when the heat radiation substrate 21 shown in FIG. 1A is attached to the cooling case 23 shown in FIG. 1B. FIG. 6 is a side view taken from the introducing port 23c side. FIG. 7 is a side view taken from the discharge port 23d side. FIG. 8 is a cross-sectional view taken along the A-A line in FIG. 5. In FIGS. 5 to 8, the circuit element portions 11A, 11B, 11C located on the heat radiation substrate 21 are omitted to facilitate the understanding of the present invention.

As shown in FIG. 8, the diffusion wall 23g is, in one example thereof, an ascending inclined surface formed from the bottom side of the first side wall 23b1 toward the bottom wall 23a. Further, the converging wall 23h is, in one example thereof, a descending inclined surface formed from the bottom wall 23a toward the bottom side of the second side wall 23b2.

Since the diffusion wall 23g and the converging wall 23h are inclined surfaces, vortexes that can occur when the diffusion wall 23g and the converging wall 23h are provided perpendicular to the introducing port 23c or the discharge port 23d can be suppressed. Further, by configuring the diffusion wall 23g and the converging wall 23h as simple inclined surfaces, it is possible to form the diffusion wall 23g and the converging wall 23h in an easy manner when the cooling case 23 is manufactured by die casting or the like. Since the diffusion wall 23g and the converging wall 23h are provided in a region between the side wall 23b and the inner surface of the bottom wall in a region opposite the fins 22, as viewed from above the cooling case, the angle of inclination of the diffusion wall 23g and the converging wall 23h with respect to the introducing port 23c or the discharge port 23d can be set by the span of this region. The span L of this region (see FIG. 4) is about 2 mm to 12 mm.

Since the diffusion wall 23g is provided inside the cooling case 23, the flow of the cooling medium, which is shown by an arrow in FIG. 5, is initially introduced from the introducing port 23c into the cooling case 23 where the flow collides with the diffusion wall 23g and diffuses along the diffusion wall 23g in the longitudinal direction inside the cooling case 23. The cooling medium then flows in a fin region 22e, in which the fins 22 are provided, in the lateral direction of the cooling case 23, in other words, in the lateral direction of the assembly of the fins 22, and exchanges heat with the heat sink. Then, the flow is converged along the converging wall 23h and discharged to the outside of the cooling case 23 from the discharge port 23d.

In the semiconductor device 1 of the present embodiment the introducing port 23c and the discharge port 23d of the cooling case 23 are provided in the side wall 23b along the longitudinal direction of the cooling case 23, and the diffusion wall 23g is provided inside the cooling case 23. As a result, the cooling medium flows in the lateral direction of the assembly (rectangular parallelepiped shape) of the fins 22. With such a configuration, the heat radiation ability can be increased by comparison with the case in which the cooling medium flows in the longitudinal direction of the assembly of the fins 22. The reason therefor is explained below. Typically, where the density of the fins 22 is increased, high heat radiation ability can be obtained, but the pressure loss increases. Further, when the cooling medium flows in the longitudinal direction of the assembly of the fins 22, the pressure loss increases over that when the cooling medium flows in the lateral direction. Accordingly, high heat radiation ability and a low pressure loss can be realized by allowing the cooling medium to flow in the lateral direction of the assembly of the fins 22 with respect to the fins 22 with a high arrangement density.

Further, where a plurality of semiconductor elements is arranged, as the circuit element portions 11A, 11B, 11C, in parallel along the longitudinal direction of the heat radiation substrate 21, as shown in FIGS. 1A-1C, the longitudinal direction of the assembly of the fins 22 is usually the same as the arrangement direction of those semiconductor elements. In this case, where the cooling medium is allowed to flow in the longitudinal direction of the assembly of the fins 22, the semiconductor elements on the downstream side in the flow direction of the cooling medium are cooled by the cooling medium warmed up by heat exchange with the semiconductor elements located on the upstream side, and the cooling effect is lower than that on the upstream side. By contrast, where the cooling medium is allowed to flow in the lateral direction of the assembly of the fins 22, as in the semiconductor device 1 of the present embodiment, the cooling medium flows in the direction orthogonal to the arrangement direction of a plurality of semiconductor elements (circuit element portions). Therefore, the unevenness of the cooling effect is reduced and the heat radiation ability can be increased, regardless of the arrangement position of the semiconductor element.

As a result of providing the diffusion wall 23g inside the cooling case 23, the flow of the cooling medium flowing in the lateral direction of the assembly of the fins 22 is made uniform. This also results in the increased heat radiation ability. The effect of improving the uniformity of the cooling medium flow is particularly significant when the fins are in the form of angular pin fins 22 or round pin fins 22A and the pins are arranged with a high density to increase the heat radiation ability. In this case, the heat radiation ability can be further increased by the combined effect of the increase in the arrangement density of pins and improved uniformity of cooling medium flow. Where the fins are in the form of angular pin fins 22 or round pin fins 22A and the pin fin diameter is 2 mm, it is preferred that the arrangement density of the pins be increased such that the pin pitch, that is, the pin arrangement spacing (distance between the centers of adjacent pins) becomes equal to or less than about 4 mm. This is because the results of thermal analysis explained in the example below demonstrate that where the pin pitch is within a range of 3 mm to 6 mm, the heat radiation ability decreases with the increase in the pitch, but where the pitch is equal to or less than 4 mm, the increase in the temperature of semiconductor elements is about 5%, the coolant flow rate is raised and the heat radiation ability is increased, thereby enabling sufficient cooling. It is also preferred that the pitch (spacing) of a plurality of adjacent pins constituting the pin fins be 1.25 times to 2 times the pin diameter. The pin diameter is the length of one side in the case of angular pins and the circle diameter in the case of round pins. The pin diameter is about 1 mm to 2 mm. In the case of angular pins with a side of 2 mm, the pitch is preferably within a range of 2.5 mm to 4 mm. This is because where the pitch is less than 2.5 mm, it is necessary to remove dust from the coolant or highly accurate machining should be performed, thereby increasing the cost.

It is preferred that the inner diameter d (see FIG. 8) of the introducing port 23c be larger than the height h of the diffusion wall 23g. More specifically, when the inner diameter d of the introducing port 23c is 10 mmφ to 15 mmφ, the height of the diffusion wall 23g is preferably within a range of 0.1 mm to 13 mm. In the example shown in FIG. 8, the inner diameter d of the introducing port 23c is equal to the inner diameter (tube diameter) of an introducing tube 23i connected to the introducing port 23c. At a larger inner diameter d of the introducing port 23c, that is, at a larger diameter of the introducing tube 23i, the pressure loss can be reduced. Where the diameter d of the introducing tube 23i has a typical value of 10 mmφ to 15 mmφ, it is preferred that the diffusion wall 23g be provided to reduce the pressure loss in the introducing port 23c. Where the height h of the diffusion wall 23g is less than 0.1 mm, the effect of providing the diffusion wall 23g is low, and whether the height is above 13 mm, the pressure loss conversely increases.

The height of the converging wall 23h can be made equal to the height h of the diffusion wall 23g. Thus, it is preferred that this height be within a range of 0.1 mm to 13 mm when the typical diameter of a discharge tube 23j connected to the discharge port 23d is 10 mmφ to 15 mmφ.

Figure 9:
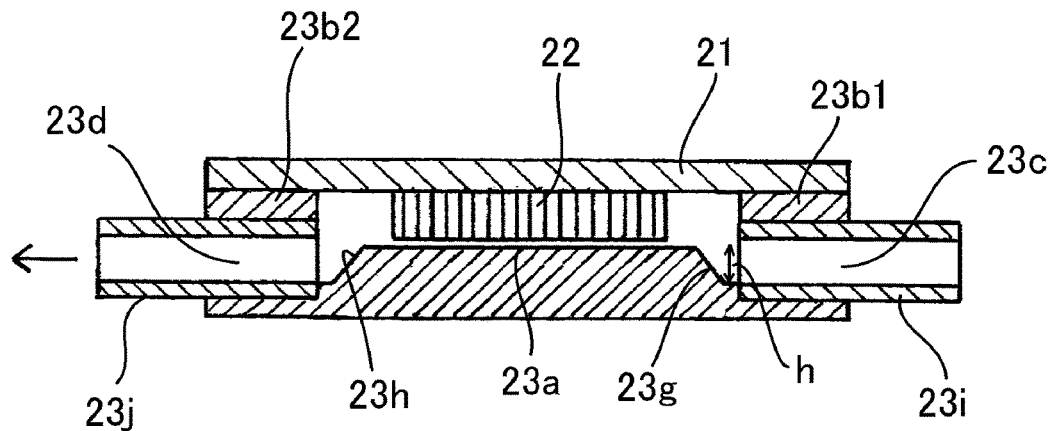
FIG. 9 is a cross-sectional view taken along the A-A line in FIG. 5 and illustrating another example of the cooling case.

In the semiconductor device 1 of the present embodiment, the introducing port 23c and the discharge port 23d of the cooling case 23 are provided in side walls 23b (23b1, 23b2) along the longitudinal direction of the cooling case 23. Therefore, hoses can be easily attached to the introducing tube 23i and the discharge tube 23j. Further, since it is not necessary to provide an introducing port for introducing the cooling medium into the cooling case 23 or a discharge port for discharging the cooling medium in the bottom wall 23a of the cooling case 23, other electronic components can be further provided below the bottom wall 23a of the cooling case 23. The shape of the bottom wall 23a of the cooling case 23 is not particularly limited, provided that other electronic components can be disposed therebelow. Thus, the outer surface of the bottom wall 23a may be flat, as shown in FIG. 9 in the cross-sectional view similar to that shown in FIG. 8. It is most preferred that the shape be used such that a recess is formed on the rear surface side of the bottom wall 23a of the cooling case 23 by the bottom wall 23a, diffusion wall 23g, and converging wall 23h, as shown in the cross-sectional view in FIG. 8, because such a shape can reduce the cost of raw materials.

In the side surface view taken from the side of the introducing port 23c of the cooling case 23, which is shown in FIG. 6, and the side surface view taken from the side of the discharge port 23d of the cooling case 23, which is shown in FIG. 7, the cooling case 23 has the same outer shape. In other words, the positions of the introducing port 23c and the discharge port 23d of the cooling case 23 are rotationally symmetrical with respect to the cooling case 23. Due to the rotational symmetry, the production of the cooling case 23 is facilitated. Further, when the introducing tube 23i and the discharge tube 23j are attached to the cooling case 23, one of the openings formed in the side wall 23b may be freely determined as the introducing port 23c and the other as the discharge port 23d. As a result, handling is facilitated.

Figure 10:
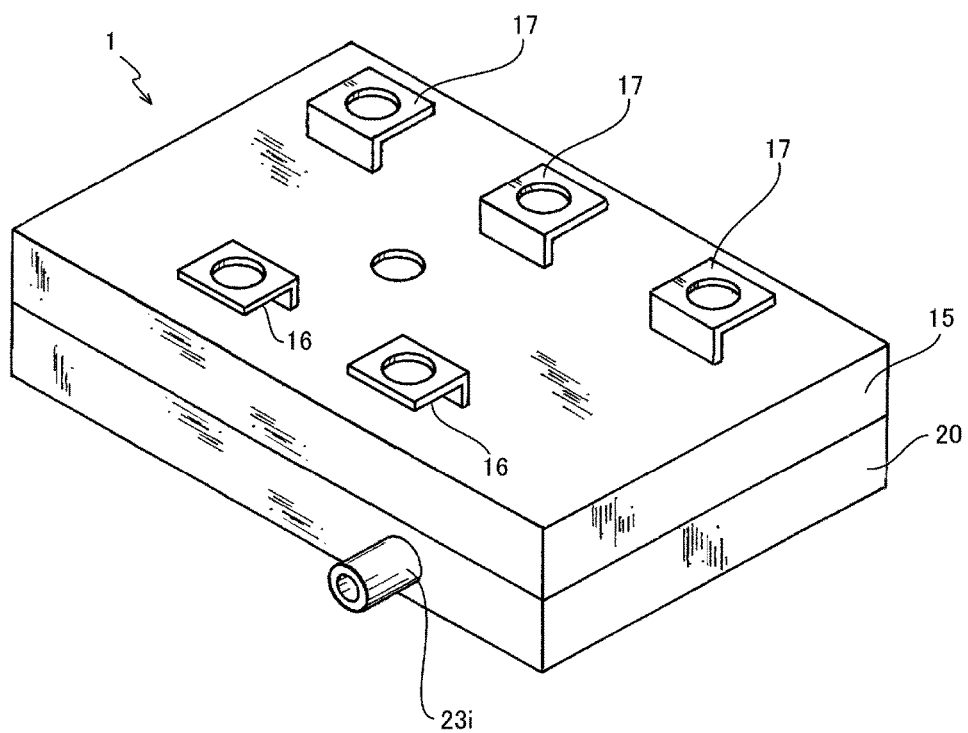
FIG. 10 is a perspective view of the semiconductor device of an embodiment in which a resin case is attached thereto.

FIG. 10 is a perspective view of the semiconductor device 1 of the embodiment in which a resin case 15 accommodating the semiconductor module 10 is attached to the circumferential edge of the heat radiation substrate 21 (not shown in the figure) on the cooling device 20. The resin case 15 shown in the figure has a substantially rectangular parallelepiped outer shape, and the dimensions thereof in the longitudinal and lateral directions, as viewed from above, are substantially the same as those of the cooling device 20. P-terminal and N-terminal 16 and U-terminal, V-terminal, and W-terminal 17 connected to the circuits of the semiconductor module 10 protrude at the upper surface of the resin case 15. The P-terminal and N-terminal 16 and U-terminal, V-terminal, and W-terminal 17 are provided along the longitudinal direction of the cooling case 23. At least one of those terminals 16, 17 can be provided along the lateral direction of the cooling case 23, but where a plurality of IGBT elements 12 and free-wheel diodes 13 are arranged in parallel as the circuit element portions 11A, 11B, 11C along the longitudinal direction of the heat radiation substrate 21, as shown in FIG. 1, by providing the terminals 16, 17 along the longitudinal direction of the cooling case 23, it is possible to reduce the inductance between the terminals 16, 17 and the IGBT elements 12 (and also free-wheel diodes 13) by comparison with the case in which the terminals are provided along the lateral direction. Further, by providing the terminals 16, 17 along the longitudinal direction of the cooling case 23, it is possible to dispose a plurality of circuit element portions 11A, 11B, and 11C, which are provided with a plurality of IGBT elements 12 that are to be connected to those terminals, close to each other. As a result, the fins 22 that radiate the heat from the circuit element portions 11A, 11B, and 11C can be formed as a single assembly. Therefore, the production of the fins 22 is facilitated and the production cost of the fins 22 can be reduced.

In the semiconductor device 1 of the present embodiment, the introducing port 23c and the discharge port 23d of the cooling case 23 are provided at positions shifted in mutually opposite directions from the central line cl, in a lateral direction, of the assembly of the fins 22 at the first side wall 23b1 and the second side wall 23b2 of the cooling case 23. It is preferred that the introducing port 23c and the discharge port 23d of the cooling case 23 be provided with the P-terminal 16 and the N-terminal 16 therebetween. Therefore, when another electronic component, for example, a film capacitor, is provided below the bottom wall 23a of the cooling case 23 and the film capacitor and the semiconductor module 10 are electrically connected by a bus bar at the shortest possible distance to reduce the inductance between the P-terminal 16 and the N-terminal 16 of the film capacitor and the semiconductor module 10, the introducing port 23c and the discharge port 23d do not interfere with the bus bar.

Figure 11:
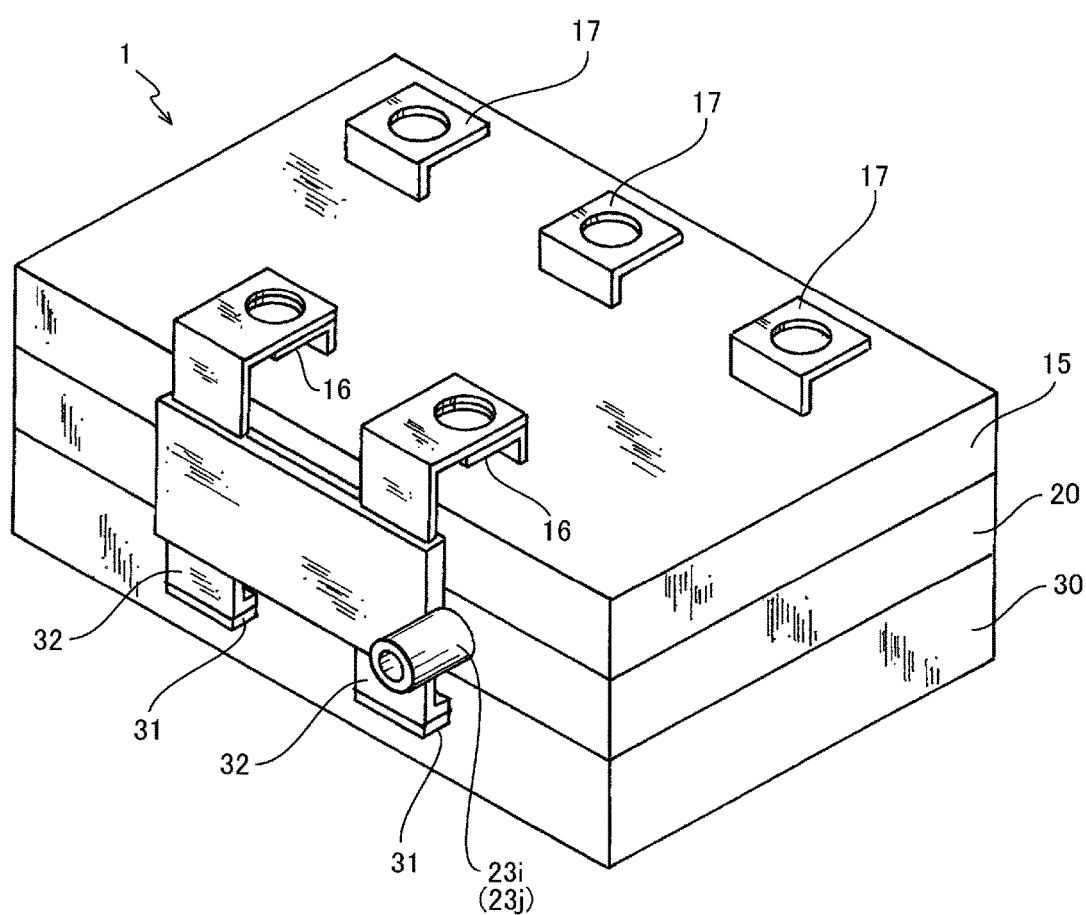
FIG. 11 is a perspective view of another embodiment of the present invention in which a film capacitor is provided.

FIG. 11 shows the embodiment of the present invention in which a film capacitor 30 is provided below the cooling device 20. In the embodiment shown in the figure, the resin case 15 accommodating the semiconductor module 10 inside thereof is provided above the cooling device 20. The terminals 16 connected to the circuit of the semiconductor module 10 protrude from the upper surface of the resin case 15. The terminals 16 and the terminals 31 of the film capacitor 30 provided below the cooling device 20 are connected to each other by bus bars 32. The introducing tube 23i connected to the introducing port 23c of the side wall 23b of the cooling case 23 of the cooling device 20 is provided at the end side with respect to the longitudinal position of the terminal 16 protruding from the resin case 15 of the semiconductor module 10 or the terminal 31 of the film capacitor 30. Therefore, the bus bar 32 does not interfere with the introducing tube 23i, and the terminal 16 of the semiconductor module 10 and the terminal 31 of the film capacitor 30 are connected at the shortest possible distance. The introducing tube 23i shown in FIG. 11 may be also the discharge tube 23j.

Similarly to the fins 22 and the heat radiation substrate 21, the material of the cooling case 23 should be selected from materials with a high thermal conductivity, or according to the structure when peripheral parts used during unit molding are involved. Where thermal conductivity is considered, materials such as A1050 and A6063 are preferred, and when sealing with peripheral members, in particular a fixing part or an inverter case accommodating a power module, is needed, materials such as ADC12 and A6061 are preferred. The cooling case 23 can be manufactured by die casting, and where thermal conductivity is needed, a material of a DMS series of aluminum alloys with a high thermal conductivity for die casting, which are manufactured by Mitsubishi Plastics, Inc., can be used. Where the cooling case 23 is formed using such metal materials, the introducing port 23c, the discharge port 23d, and the flow path inside the cooling case 23, such as described hereinabove, can be formed, for example, by die casting. A material obtained by including a carbon filler in a metal material can be used for the cooling case 23. Depending on the type of the cooling medium and the temperature of the cooling medium flowing inside the cooling case 23, a ceramic material or a resin material can be also used.

EXAMPLES

Thermal analysis of the temperature of each IGBT element was performed with respect to the semiconductor device of the present embodiment, which constitutes the three-phase inverter circuit shown in FIG. 1, as an example. As a comparative example, thermal analysis of the temperature of each IGBT was performed with respect to a semiconductor device configured in the same manner as in the example, except that the introducing port and discharge port were provided in the side wall along the lateral direction of the cooling case and the cooling medium was allowed to flow in the longitudinal direction of the assembly of the fins 22. The analysis conditions in the example and comparative example were as follows. The cooling medium was water that included 50 vol % of a long-life coolant (LLC) and had a temperature of 65° C. The flow rate of the cooling medium was 10 L/min. The generation loss for each IGBT was taken as 360 W per 1 chip, the loss of FWD was taken as 45 W, and an inverter operation was presumed. The fins 22 were angular pins with a side of 2 mm, and the fin pitch was 3 mm. The pressure loss in the example was 5.8 kPa, and the pressure loss in the comparative example was 30 kPa.

Figure 12:
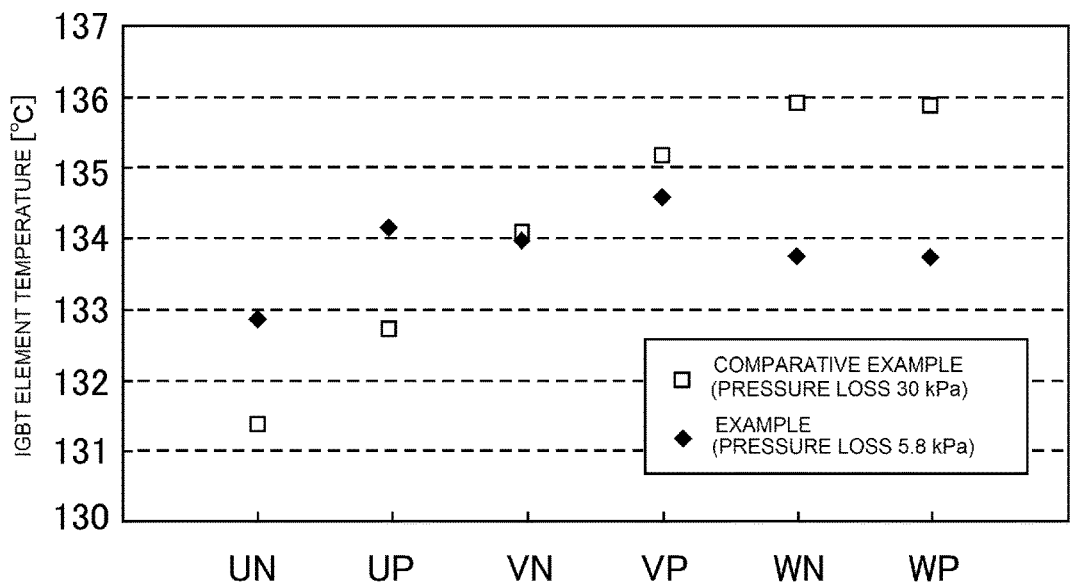
FIG. 12 is graph showing the temperature of the IGBT element in an example and a comparative example.

FIG. 12 is a graph showing the temperature of each IGBT element in the example and comparative example. Here, WP to UN on the abscissa represent the positions of six IGBT elements. WP and WN show the IGBT elements of the upper arm and lower arm, respectively, in the W-phase circuit element portion 11A. Likewise, VP and VN show the IGBT elements of the upper and lower arms in the V-phase circuit element portion 11B, and UP and UN show the IGBT elements of the upper and lower arms in the U-phase circuit element portion 11C. It follows from FIG. 12 that in the comparative example, the temperature of the IGBT element positioned on the downstream side in the flow direction of the cooling medium rises, whereas in the example, the IGBT elements have substantially the same temperature and excellent heat radiation ability is demonstrated.

The pressure loss at various values of the height of the diffusion wall 23g was then examined for the semiconductor device of the embodiment shown in FIGS. 1A-1C with respect to the cases in which the diameter of the introducing tube 23i connected to the introducing port 23c and the discharge tube 23j connected to the discharge port 23d was 6 mmϕ, 9 mmϕ, and 12 mmϕ. The results are shown by a graph in FIG. 13.

Figure 13:
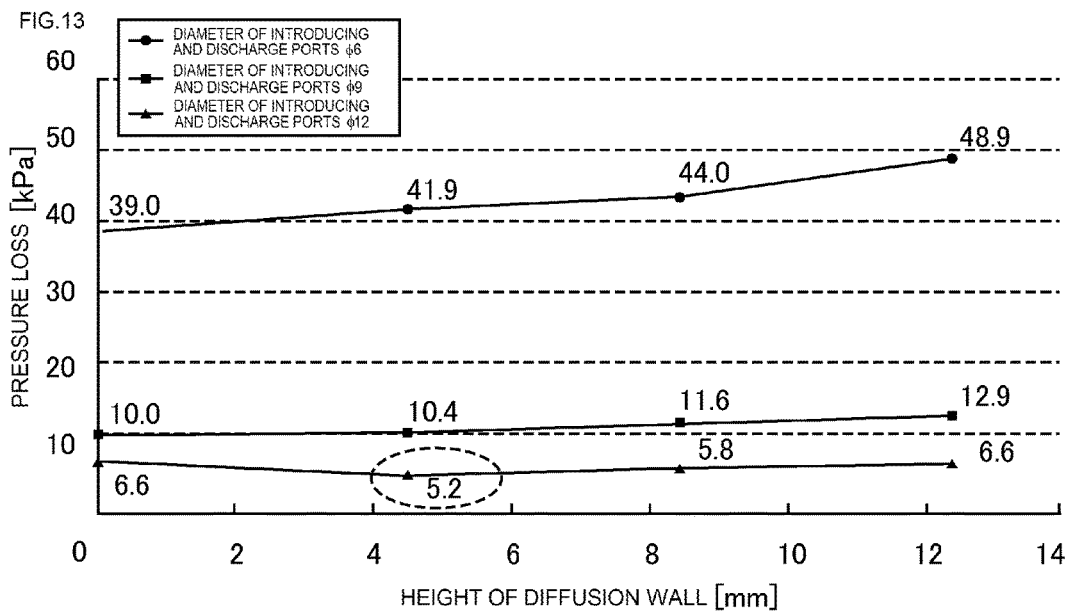
FIG. 13 is a graph illustrating the relationship between the height of the diffusion wall and the pressure loss.

As mentioned hereinabove, the typical diameter of the introducing tube 23i and the discharge tube 23j is 10 mmϕ to 15 mmϕ, and the tube diameter of 6 mmϕ and 9 mmϕ, which is shown in FIG. 13, is less than the typical tube diameter. In this case, the pressure loss is higher than that with a tube diameter of 12 mmϕ, and the pressure loss increases with the height of the diffusion wall. This result can be explained as follows. When the diameter of the introducing port is small, the region in which the cooling medium is introduced into the cooling case is also small. Therefore, the pressure in the entire region including the fin portion rises, and the provided diffusion wall further inhibits the introduction of the coolant.

By contrast, with a tube diameter of 12 mmϕ, which is within the range of typical tube diameters, the provided diffusion wall decreases the pressure loss by comparison with the case in which no diffusion wall is provided (the diffusion wall height is 0). This is apparently because by providing the diffusion wall, it is possible to reduce the pressure loss in the vicinity of the introducing port. It follows from FIG. 13, that the effect of decreasing the pressure reduction by providing the diffusion wall is demonstrated as long as the diffusion wall is provided and this effect can be observed when the diffusion wall height is within a range below 13 mm (inclusive).

Figure 14:
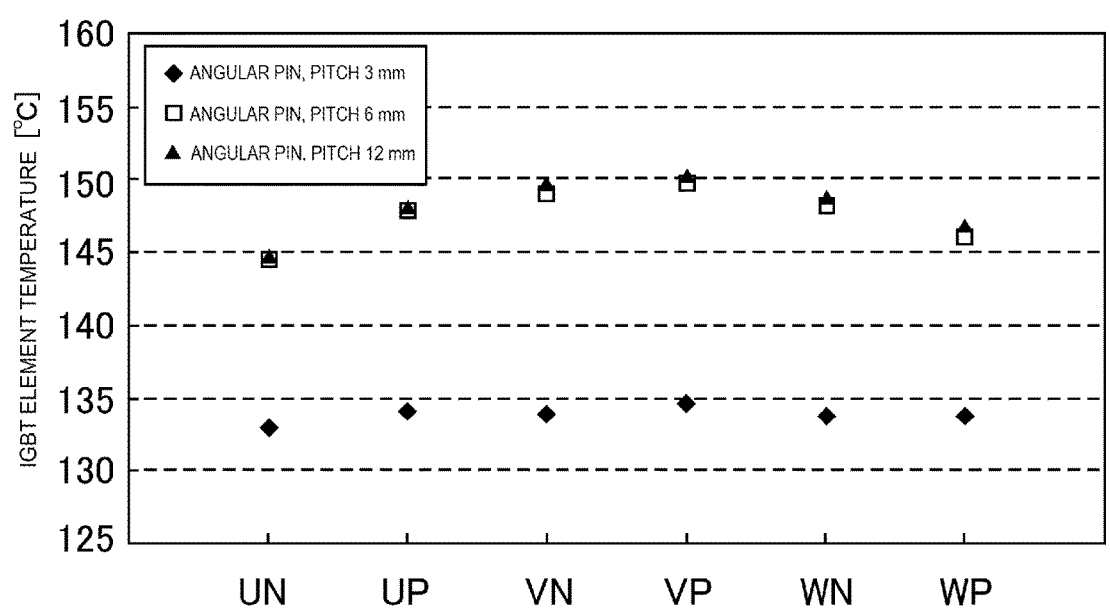
FIG. 14 is a graph illustrating the relationship between the pitch of angular pins and the temperature of the IGBT element.

Thermal analysis of IGBT temperature was then performed for the semiconductor device of the present embodiment, which constitutes the three-phase inverter circuit shown in FIGS. 1A-1C, with respect to the case in which angular pins with a side of 2 mm were used as the fins 22 and the fin pitch was 3 mm, 6 mm, and 12 mm, by way of examples. The results are shown in the graph in FIG. 14. In FIG. 14, WP to UN on the abscissa represent the positions of six IGBT elements, in the same manner as in FIG. 12.

It follows from FIG. 14 that the cooling medium flowed in the fin portion closer to the introducing tube and the flow velocity in the central portion of the fin assembly decreased with the increase in the fin pitch, that is, the decrease in the fin density. As a result, the temperature of the IGBT elements at the VN and VP positions was higher than that of other IGBT elements. The unevenness of flow velocity of the cooling medium was significant at a low fin density.

In the above-described embodiment, the case is explained in which a plurality of semiconductor elements (circuit element portions) that are thermally or electrically equivalent and have the same generation loss are arranged in parallel in the longitudinal direction of the cooling device. However, the present invention is not limited to the above-mentioned configuration and can be also applied to a semiconductor module including some semiconductor elements (circuit element portions) of different generation loss. Further, a plurality of circuit element portions may be formed on one insulating substrate.

EXPLANATION OF REFERENCE NUMERALS 1 semiconductor device
10 semiconductor module
11A, 11B, 11C circuit element portion
12 IGBT element
13 free-wheel diode
14 insulating substrate
15 resin case
16, 17 terminals
20 cooling device
21 heat radiation substrate
22, 22A, 22B fins
22e fin region
23 cooling case
23a bottom wall
23b side wall
23c introducing port
23d discharge port
23e O-ring
23f threaded hole
23g diffusion wall
23h converging wall
23i introducing tube
23j discharge tube
30 film capacitor
31 terminal
32 bus bar
40 inverter circuit
41 three-phase AC motor

What is claimed is:

1. A semiconductor device comprising:
an insulating substrate;
a semiconductor element carried on the insulating substrate; and
a cooling device that cools the semiconductor element, wherein
the cooling device includes:
a heat radiation substrate joined to the insulating substrate;
a plurality of fins provided in a substantially rectangular region on a surface of the heat radiation substrate on a side opposite that of a surface joined to the insulating substrate; and
a cooling case of a box-like shape that accommodates the fins and has a bottom wall and side walls;
an introducing port and a discharge port for a cooling medium are provided at positions shifted in mutually opposite directions from a laterally central line of an assembly of the fins in a pair of a first side wall and a second side wall provided along a longitudinal direction of the assembly of the fins, among the side walls of the cooling case; and a diffusion wall causing the cooling medium introduced from the introducing port to diffuse along the first side wall is provided between the first side wall, in which the introducing port is provided, and the bottom wall; wherein an opening in the introducing port is opposite to the diffusion wall.

2. The semiconductor device according to claim 1, wherein a converging wall causing the cooling medium to converge toward the discharge port along the second side wall is provided between the second side wall, in which the discharge port is provided, and the bottom wall.

3. The semiconductor device according to claim 1, wherein the diffusion wall is an ascending inclined surface formed from a bottom side of the first side wall toward the bottom wall.

4. The semiconductor device according to claim 2, wherein the converging wall is a descending inclined surface formed from the bottom wall toward a bottom side of the second side wall.

5. The semiconductor device according to claim 3, wherein an inner diameter of the introducing port is larger than a height of the diffusion wall.

6. The semiconductor device according to claim 5, wherein the inner diameter of the introducing port is 10 mm to 15 mm and the height of the diffusion wall is 0.1 mm to 13 mm.

7. The semiconductor device according to claim 1, wherein the positions of the introducing port and the discharger port are rotationally symmetrical with respect to the cooling case.

8. The semiconductor device according to claim 3, wherein a recess on a rear surface side of the bottom wall of the cooling case is formed by the bottom wall, the diffusion wall, and the converging wall.

9. The semiconductor device according to claim 1, wherein terminals of the semiconductor device are provided along the longitudinal direction of the cooling case.

10. The semiconductor device according to claim 1, wherein the fins are pin fins.

11. The semiconductor device according to claim 10, wherein the pin fins are constituted by a plurality of pins, and a pitch of the pins is 1.25 times to 2 times the pin diameter.

12. The semiconductor device according to claim 1, wherein a film capacitor is attached to the bottom wall of the cooling device.

13. The semiconductor device according to claim 2, wherein the positions of the introducing port and the discharger port are rotationally symmetrical with respect to the cooling case.

14. The semiconductor device according to claim 4, wherein a recess on a rear surface side of the bottom wall of the cooling case is formed by the bottom wall, the diffusion wall, and the converging wall.

15. The semiconductor device according to claim 2, wherein terminals of the semiconductor device are provided along the longitudinal direction of the cooling case.

16. The semiconductor device according to claim 2, wherein the fins are pin fins.

17. The semiconductor device according to claim 2, wherein a film capacitor is attached to the bottom wall of the cooling device.

18. A semiconductor apparatus, comprising:
a cooling device configured to cool a semiconductor element component, the cooling device including
a case having a plurality of sides, a first side of the plurality of sides having an introducing port for a cooling medium and a second side of the plurality of sides, opposite to the first side, having a discharge port for the cooling medium, wherein
the introducing port is closer to a third side of the plurality of sides than to a fourth side, opposite to the third side, of the plurality of sides, and the discharge port is closer to the fourth side of the plurality of sides than to the third side;
the case further having a bottom surface comprising a substantially flat middle portion and side portions each angling away from the middle portion toward one of the first side or the second side of the case;
the cooling device further including
a heat radiation substrate; and
a plurality of fins on a side of the heat radiation substrate opposite to the substantially flat middle portion of a bottom surface of the case.

19. The semiconductor device according to claim 3, wherein the plurality of fins are above the diffusion wall.

* * * * *